(12) United States Patent
Sakamoto

(10) Patent No.: US 7,960,748 B2
(45) Date of Patent: Jun. 14, 2011

(54) SEMICONDUCTOR LIGHT EMITTING DEVICE AND METHOD FOR MANUFACTURING THE SAME

(75) Inventor: Hironobu Sakamoto, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 224 days.

(21) Appl. No.: 12/394,948

(22) Filed: Feb. 27, 2009

(65) Prior Publication Data
US 2009/0212315 A1 Aug. 27, 2009

(30) Foreign Application Priority Data

Feb. 27, 2008 (JP) ................................. 2008-046249

(51) Int. Cl.
  *H01L 29/22* (2006.01)
  *H01L 29/227* (2006.01)
  *H01L 33/00* (2006.01)
  *H01L 29/24* (2006.01)
  *H01L 31/0203* (2006.01)

(52) U.S. Cl. ............ 257/98; 257/99; 257/100; 257/433; 257/434; 257/E33.056; 257/E33.057; 257/E33.058; 257/E33.059

(58) Field of Classification Search .................. 257/98, 257/99, 100, 433, 434, E33.056, E33.057, 257/E33.058, E33.059
See application file for complete search history.

(56) References Cited

U.S. PATENT DOCUMENTS

| | | | |
|---|---|---|---|
| 6,060,729 A * | 5/2000 | Suzuki et al. .................. 257/99 |
| 6,593,598 B2 * | 7/2003 | Ishinaga ........................ 257/98 |
| 6,670,648 B2 * | 12/2003 | Isokawa et al. ................. 257/99 |
| 6,956,245 B2 * | 10/2005 | Senda et al. .................... 257/94 |
| 7,157,853 B2 | 1/2007 | Imai et al. |
| 2004/0173808 A1 * | 9/2004 | Wu .................................. 257/99 |
| 2005/0162069 A1 * | 7/2005 | Ota et al. ....................... 313/501 |
| 2006/0043407 A1 * | 3/2006 | Okazaki ......................... 257/100 |
| 2007/0187705 A1 * | 8/2007 | Tanaka et al. ................... 257/98 |
| 2008/0079018 A1 * | 4/2008 | Kimura et al. .................. 257/98 |
| 2008/0272383 A1 * | 11/2008 | Loh ................................. 257/98 |
| 2008/0283862 A1 * | 11/2008 | Fujii ............................... 257/99 |
| 2010/0072506 A1 * | 3/2010 | Bae et al. ........................ 257/99 |
| 2010/0224904 A1 * | 9/2010 | Lee et al. ........................ 257/99 |

FOREIGN PATENT DOCUMENTS

JP  2004127604  4/2004

* cited by examiner

*Primary Examiner* — Ida M Soward
(74) *Attorney, Agent, or Firm* — Kenealy Vaidya LLP

(57) ABSTRACT

A semiconductor light emitting device is provided so that an optical axis thereof is properly set parallel with the mounting board when the device is mounted on the mounting board. The semiconductor light emitting device can have a structure in that light can be incident on the light guide plate with high efficiency and uniform introduction into the light guide plate. A multi-piece substrate can include electrodes, a plurality of semiconductor light emitting elements, and a sealing resin for sealing them simultaneously. The thus obtained integrated substrate is cut into individual semiconductor light emitting device bodies. On one of the cut end faces, which serves as a surface to be mounted onto a mounting board, a light-shielding reflective film can be coated over an area from the edge of the light emission surface of the sealing resin to at least part of the substrate. On the other cut end face, the sealing resin can be covered with a light-shielding reflective film.

25 Claims, 11 Drawing Sheets

SEMICONDUCTOR LIGHT EMITTING DEVICE AND METHOD FOR MANUFACTURING THE SAME

This application claims the priority benefit under 35 U.S.C. §119 of Japanese Patent Application No. 2008-046249 filed on Feb. 27, 2008, which is hereby incorporated in its entirety by reference.

BACKGROUND

1. Technical Field

The presently disclosed subject matter relates to a semiconductor light emitting device, and in particular, to a semiconductor light emitting device that can serve as a light source for emitting light to be introduced into a light guide plate of a backlight system for a liquid crystal display or the like. The presently disclosed subject matter also relates to a method for manufacturing the semiconductor light emitting device.

2. Description of the Related Art

Conventional backlight systems (for use in a liquid crystal display device, a translucent non-illumination display element for characters and figures, and the like) are mainly composed of a light guide plate and a light source for emitting light to be introduced into the light guide plate. Examples of such a light source include a fluorescent lamp (in particular, a cold cathode fluorescent lamp), a semiconductor light emitting device (in particular, an LED), and the like. Of these, LEDs are small in size, light in weight, and easy to be driven with a simple driving circuit and method. Many portable devices having a small-sized liquid crystal display device employ such LEDs as a light source for the backlight system.

A common backlight system can include a mounting board 50, and a light guide plate 51 and an LED 52 which are disposed on the mounting substrate 50, as shown in FIG. 1. In this configuration, the LED 52 has an optical axis X that is substantially perpendicular to the light incident surface 53 of the light guide plate 51 and substantially parallel with the surface of the mounting board 50. In other words, the LED 52 is of a side-view type.

The LED 52 of this type can include a device substrate 54, an LED element 55 mounted on the substrate 54, and a sealing body 56 made of a resin for sealing these components. The sealing body 56 can have a surface on the mounting board 50 side and an outer surface on the opposite side to the mounting board 50. Light-shielding reflective members 57a and 57b are provided to these surfaces of the sealing body 56.

The LED 52 can emit light which may be directed to the pair of the light-shielding reflective members 57a and 57b of the sealing body 56. The incident light is reflected by the light-shielding reflective members 57a and 57b to be converged within the thickness range of the light guide plate 51, and then is incident on the light incident surface 53 of the light guide plate 51 to enter the light guide plate 51. The sealing body 56 can have a surface 58a which is substantially perpendicular to the optical axis X and a pair of surfaces 58b and 58c to which no light-shielding reflective member is provided and which are substantially parallel with the optical axis X. The LED 52 can emit light which is directed to these surfaces 58a, 58b, and 58c to be diffused in the width direction of the light guide plate 51. Then, the diffused light is incident on the light guide plate 51 from the light incident surface 53 thereof. This configuration can allow the light emitted from the LED 52 to effectively enter the entire incident surface 53 of the light guide plate 51 so that the light can be spread over the light guide plate 51 in the parallel direction with the surface thereof. This can achieve a uniform and bright backlight system. (See, for example, Japanese Patent Application Laid-Open No. 2004-127604.)

SUMMARY

In general, when a side-view type LED with a thickness of 0.5 mm or more is fabricated, the following method can be employed. Namely, using a separate frame body made of an insulating material with pn electrodes formed thereon, die-bonding of an LED element, an inter-electrode connection by bonding wire, filing of a sealing resin material, and the like are carried out one by one to produce a single LED.

When another side-view type LED with a thinner size is fabricated, the following method can be employed. Namely, a plurality of LED elements are mounted on a device substrate or a multi-piece substrate at predetermined intervals. A sealing resin material is applied over the entire surfaces of the plurality of the mounted LED elements so as to form a sealing body. Then, the entire body is cut into separate pieces of LEDs with a predetermined size.

In the latter case illustrated by FIG. 2, the resultant LED 60 has a pair of opposed cut surfaces 62a and 62b which are parallel with the optical axis of the LED element 61 and flat. Furthermore, the device substrate 63 includes a pair of electrodes 64 and 65 extending from the surface where the LED element 61 is to be mounted to the rear surface of the device substrate 63 opposite to the mounting surface, via vertical end faces adjacent to both the cut surfaces 62a and 62b.

Light-shielding reflective members 67a and 67b are provided to the cut surfaces 62a and 62b at the sealing body 66 of the LED 60 so as to converge the light emitted from the LED element 61. In this case, a step is formed between each of the cut surfaces 68a and 68b of the device substrate 63 and the corresponding one of the light-shielding reflective members 67a and 67b on the cut faces 69a and 69b of the sealing body 66 by the thickness of the light-shielding reflective member (67a or 67b).

Suppose the case that the LED 60 having the light-shielding reflective members 67a and 67b is arranged on an electrode pad 71 provided to a circuit pattern formed on the mounting board 70 to be soldered, as illustrated in FIG. 3. In this case, the LED 60 may be bonded with the solder 72 to the mounting board 70 in an inclined state under the following conditions including the cases where: the LED 60 is positioned with insufficient accuracy when it is temporarily fixed to a solder paste applied onto the electrode pad 71 of the board 70 in advance; a suction collet cannot push the LED 60 at a proper position or in a proper pressurizing direction; the electrodes 64 and 65 on the device substrate 63 may receive an uneven drawing force toward the electrode pad 71 due to the contraction of the thermal-cured solder paste.

In any of these cases, the optical axis X of the LED 60 might not be parallel with the surface 73 of the mounting board. For example, the optical axis X might be inclined upward with respect to the mounting board surface 73 by an angle of α. Accordingly, the efficiency of the light incident on the light guide plate 74 with respect to the total amount of the light emitted from the LED 60 may deteriorate, resulting in reduction of the brightness of the backlight system. In addition to this, part of the light 75 emitted from the LED 60 can illuminate areas other than the light incident surface 76 of the light guide plate 74. This light leakage can adversely affect illumination of the optical system.

The presently disclosed subject matter was devised in view of these and other characteristics, features, and problems and in association with the conventional art. According to an aspect of the presently disclosed subject matter, a semiconductor light emitting device can have a configuration so that an optical axis thereof can be properly set parallel with the mounting board when the device is mounted on the mounting board as well as a structure in that light can be incident on the light guide plate with high efficiency and uniform introduction into the light guide plate. According to another aspect of the presently disclosed subject matter, there is provided a method for manufacturing the semiconductor light emitting device configured as described above.

A semiconductor light emitting device according to one aspect of the presently disclosed subject matter can have an optical axis and a first end face and a second end face both of which are parallel with each other and with the optical axis. The semiconductor light emitting device can include: an insulating support; a pair of electrodes formed on and extending from one surface of the insulating support to the other surface thereof via opposite side faces thereof; a housing having a groove having a bottom, the housing disposed adjacent (i.e., on or near) the insulating support so that the pair of electrodes can be partly exposed at the bottom of the groove; a semiconductor light emitting element disposed adjacent (i.e., on or near) the bottom of the groove and connected to the exposed pair of electrodes; and a sealing resin filled in the groove of the housing. Here, the insulating support, the pair of electrodes, the housing and the sealing resin can have respective end faces that are substantially flush with one another and that can define the opposite first and second end faces. The semiconductor light emitting device can further include: a first light-shielding reflective member provided on the first end face so as to extend adjacent (i.e., near or from) an edge at the light emission side of the sealing resin to at least the other edge thereof in the optical axis direction and with the same width as that of the end face of the sealing resin in a direction perpendicular to the optical axis; and a second light-shielding reflective member provided on the second end face so as to extend adjacent (i.e., near or from) the edge at the light emission side of the sealing resin over the other edge at least to part of the end face of the insulating support in the optical axis direction and with the same width as that of the end face of the sealing resin in the direction perpendicular to the optical axis.

In the semiconductor light emitting device configured as described above, the second light-shielding reflective member can be provided at least at a middle position of the end face of the insulating support in the optical axis direction.

In the semiconductor light emitting device configured as described above, the first light-shielding reflective member can be provided from the edge at the light emission side of the sealing resin over the other edge thereof to the middle position, or opposite position to the light emission side, of the end face of the insulating support in the optical axis direction.

In the semiconductor light emitting device configured as described above, on the second end face a third light-shielding reflective member can be provided at least at one location on the end face of the insulating support.

In the semiconductor light emitting device configured as described above, any of, or both of, the first light-shielding reflective member and the second light-shielding reflective member can be provided with a width that is wider than the end face of the sealing resin in a direction perpendicular to the optical axis.

In the semiconductor light emitting device configured as described above, any of, or both of, the first light-shielding reflective member and the second light-shielding reflective member can be provided so as to be separated by a predetermined distance away from the edge at the light emission side of the sealing resin in the optical axis direction.

In the semiconductor light emitting device configured as described above, the second end face may be a side that is to be mounted on a mounting board of a backlight system, for example.

A semiconductor light emitting device according to another aspect of the presently disclosed subject matter can be fabricated by:

preparing a multi-piece semiconductor light emitting device body including an insulating support, a pair of electrodes formed on and extending from one surface of the insulating support to the other surface thereof via opposite side faces thereof, a housing having a groove having a bottom, the housing disposed adjacent (i.e., on or near) the insulating support so that the pair of electrodes are partly exposed at the bottom of the groove, a plurality of semiconductor light emitting elements disposed adjacent (i.e., on or near) the bottom of the groove at predetermined intervals and connected to the exposed pair of electrodes, and a sealing resin filled in the groove of the housing so as to seal the plurality of semiconductor light emitting elements entirely;

cutting the multi-piece semiconductor light emitting device body at the predetermined intervals to produce an individual semiconductor light emitting device body having a pair of opposite cut end faces;

providing a light-shielding reflective member on one of the cut end faces of the individual semiconductor light emitting device body so as to cover an entire exposed face of the sealing resin; and providing another light-shielding reflective member on the other cut end face so as to cover an area from an edge of a light emission surface of the sealing resin to at least a middle position of the insulating support in an optical axis direction of the semiconductor light emitting element with at least a same width as that of the exposed face of the sealing resin in a direction perpendicular to the optical axis.

In the semiconductor light emitting device configured as described above, on the one cut end face the light-shielding reflective member can be provided, in the optical axis direction, to cover any one of an area from the edge of the light emission surface of the sealing resin to an opposite edge at the semiconductor light emitting element side of the sealing resin, an area from the edge of the light emission surface of the sealing resin to at least an end portion of the electrodes positioned adjacent to the semiconductor light emitting element mounted thereon to entirely cover the end portion, and an area from the edge of the light emission surface of the sealing resin to a middle position of the insulating support, and, in the direction perpendicular to the optical axis, an area with the same width as that of the sealing resin.

A semiconductor light emitting device according to still another aspect of the presently disclosed subject matter can be fabricated by:

preparing a multi-piece semiconductor light emitting device body including an insulating support, a pair of electrodes formed on and extending from one surface of the insulating support to the other surface thereof via opposite side faces thereof, a housing having a groove having a bottom, the housing disposed adjacent (i.e., on or near) the insulating support so that the pair of electrodes are partly exposed at the bottom of the groove, a plurality of semiconductor light emitting elements disposed adjacent (i.e., on or near) the bottom of the groove at predetermined intervals and connected to the exposed pair of electrodes, and a sealing resin filled in the groove of the housing so as to seal the plurality of semiconductor light emitting elements entirely;

cutting the multi-piece semiconductor light emitting device body at the predetermined intervals to produce an individual semiconductor light emitting device body having a pair of opposite cut end faces;

providing a light-shielding reflective member on one of the cut end faces of the individual semiconductor light emitting device body so as to cover an area from a position by a predetermined distance separated away from an edge of a light emission surface of the sealing resin to an opposite edge at the semiconductor light emitting element side of the sealing resin in the optical axis direction; and providing another light-shielding reflective member on the other cut end face so as to cover an area from a position by a predetermined distance separated away from an edge of the light emission surface of the sealing resin to at least a middle position of the insulating support in the optical axis direction of the semiconductor light emitting element with at least a same width as that of the sealing resin in a direction perpendicular to the optical axis.

A semiconductor light emitting device according to still another aspect of the presently disclosed subject matter can be fabricated by:

preparing a multi-piece semiconductor light emitting device body including an insulating support, a pair of electrodes formed on and extending from one surface of the insulating support to the other surface thereof via opposite side faces thereof, a housing having a groove having a bottom, the housing disposed adjacent (i.e., on or near) the insulating support so that the pair of electrodes are partly exposed at the bottom of the groove, a plurality of semiconductor light emitting elements disposed adjacent (i.e., on or near) the bottom of the groove at predetermined intervals and connected to the exposed pair of electrodes, and a sealing resin filled in the groove of the housing so as to seal the plurality of semiconductor light emitting elements entirely;

cutting the multi-piece semiconductor light emitting device body at the predetermined intervals to produce an individual semiconductor light emitting device body having a pair of opposite cut end faces;

providing a light-shielding reflective member on one of the cut end faces of the individual semiconductor light emitting device body so as to cover an entire exposed face of the sealing resin;

providing another light-shielding reflective member on the other cut end face so as to cover an area from an edge of a light emission surface of the sealing resin to at least an end portion of the electrodes positioned adjacent to the semiconductor light emitting element mounted thereon to entirely cover the end portion in an optical axis direction of the semiconductor light emitting element with at least a same width as that of the exposed face of the sealing resin in a direction perpendicular to the optical axis; and providing still another light-shielding reflective member on the insulating support at least at one location.

In the semiconductor light emitting device configured as above, on the one cut end face the light-shielding reflective member can be provided, in the optical axis direction, to cover any one of an area from the edge of the light emission surface of the sealing resin to an opposite edge at the semiconductor light emitting element side of the sealing resin, an area from the edge of the light emission surface of the sealing resin to at least an end portion of the electrodes positioned adjacent to the semiconductor light emitting element mounted thereon to entirely cover the end portion, and an area from the edge of the light emission surface of the sealing resin to a middle position of the insulating support, and, in the direction perpendicular to the optical axis, an area with the same width as that of the sealing resin.

In the semiconductor light emitting device configured as above, on the one cut end face the light-shielding reflective member can be provided, in the optical axis direction, to cover an area from the edge of the light emission surface of the sealing resin to at least an end portion of the electrodes positioned adjacent to the semiconductor light emitting element mounted thereon to entirely cover the end portion with at least the same width as that of the exposed face of the sealing resin in a direction perpendicular to the optical axis, and still another light-shielding reflective member is provided on the insulating support at least at one location.

In accordance with one aspect of the presently disclosed subject matter, a plurality of semiconductor light emitting elements can be mounted on a device mounting substrate or a multi-piece substrate at predetermined intervals, and a sealing resin material can be applied over the entire surfaces of the plurality of the mounted semiconductor light emitting elements so as to form a sealing body. Then, the entire body can be cut into separate pieces of semiconductor light emitting devices with a predetermined size. In this case, the resultant semiconductor light emitting device can have a pair of opposed cut surfaces which can be defined by cut surfaces (end faces) of respective components that are substantially flush with one another. The pair of the cut surfaces of the semiconductor light emitting device are denoted by a first end face and a second end face. On the first end face, a light-shielding reflective member can be provided so as to cover at least the entire surface of the exposed end face of the sealing resin (or except for the vicinity of the end portion near the light emission surface side). On the second end face, another light-shielding reflective member can be provided so as to cover the entire surface of the exposed end face of the sealing resin and at least part of the end face of the substrate over the sealing resin end face (or except for the vicinity of the end portion near the light emission surface side). In this instance, the light-shielding reflective member can be provided by coating, printing, or the like.

When the semiconductor light emitting device provided with the light-shielding reflective member is mounted on a mounting board of, for example, a backlight system, the second end face of the semiconductor light emitting device (on the side where the light-shielding reflective member is provided to cover the entire exposed end face of the sealing body and at least part of the end face of the substrate) can be made to become a surface to be mounted on, and bonded to, the board. This configuration can allow the semiconductor light emitting device to be mounted on the board without being inclined with respect to the board.

When the semiconductor light emitting device made in accordance with the principle of the presently disclosed subject matter is used to serve as a light source for a backlight system including a planar light guide plate, light leakage from portions other than the light emission surface of the sealing resin of the semiconductor light emitting device can be effectively suppressed or prevented. Furthermore, the brightness deterioration or directivity due to uneven light distribution in the light guide plate can be prevented.

BRIEF DESCRIPTION OF THE DRAWINGS

These and other characteristics, features, and advantages of the presently disclosed subject matter will become clear from the following description with reference to the accompanying drawings, wherein.

DETAILED DESCRIPTION OF EMBODIMENTS

A description will now be made below to exemplary embodiments of semiconductor light emitting devices of the presently disclosed subject matter with reference to FIG. 4 through FIG. 13.

According to an aspect of the presently disclosed subject matter, a semiconductor light emitting device can have a configuration so that an optical axis thereof is properly parallel with the mounting board when the device is mounted on the mounting board. Furthermore, this configuration can allow the emitted light to be incident on the light guide plate with high efficiency and uniform introduction into the light guide plate.

Figure 1:
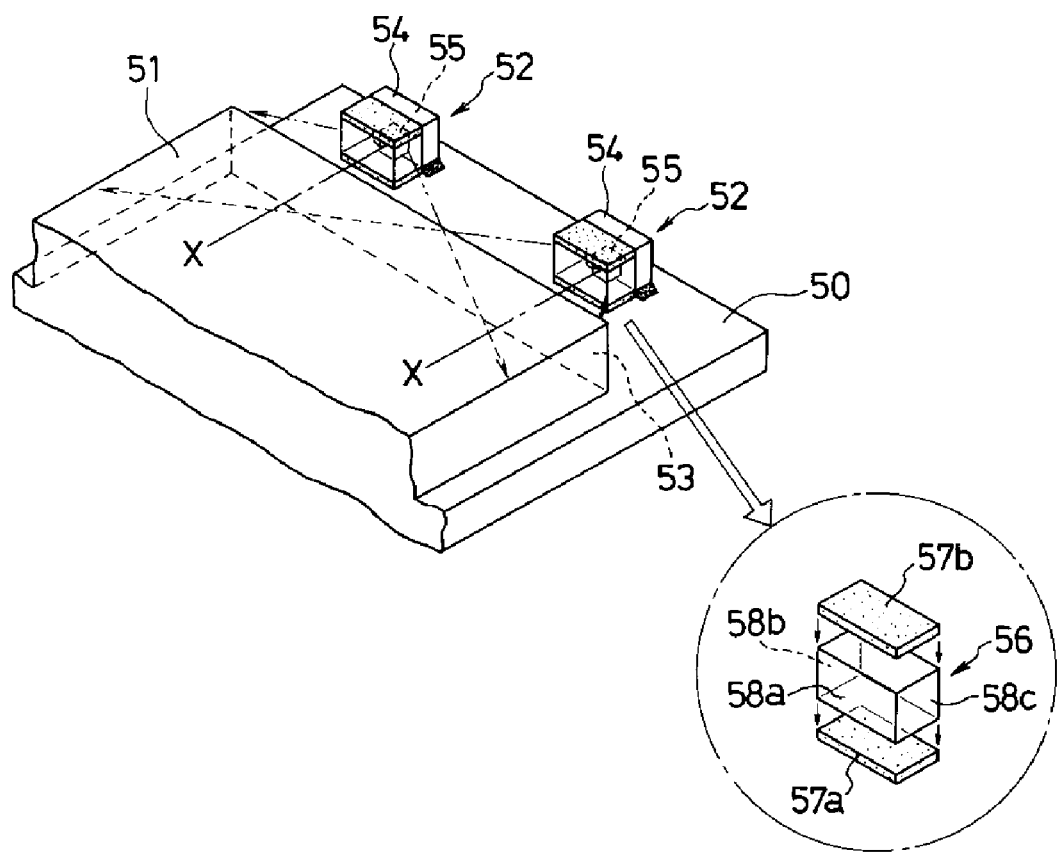
FIG. 1 is a diagram illustrating a conventional semiconductor light emitting device that is mounted on a board.
Figure 2:
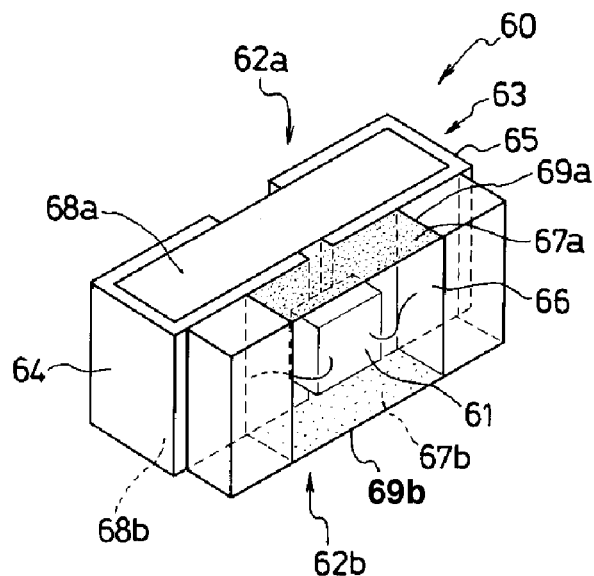
FIG. 2 is a diagram illustrating a basic configuration of the conventional semiconductor light emitting device.
Figure 3:
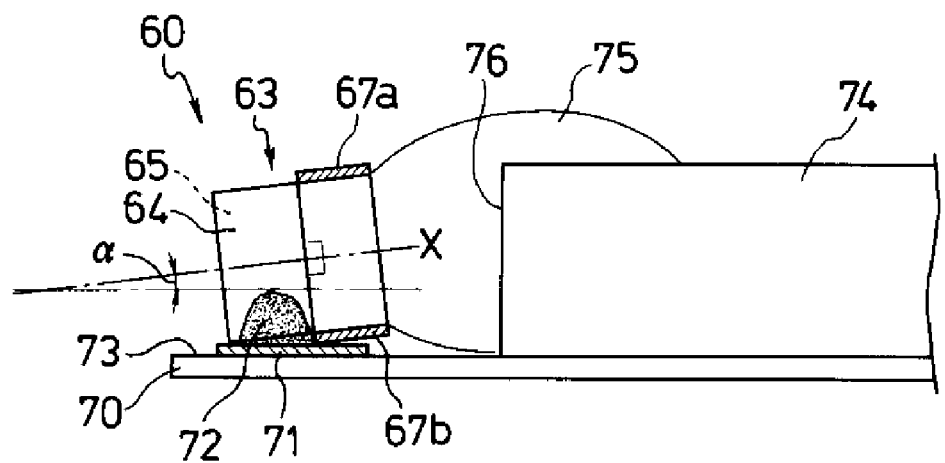
FIG. 3 is a side view illustrating a conventional semiconductor light emitting device that is mounted on a board.
Figure 4:
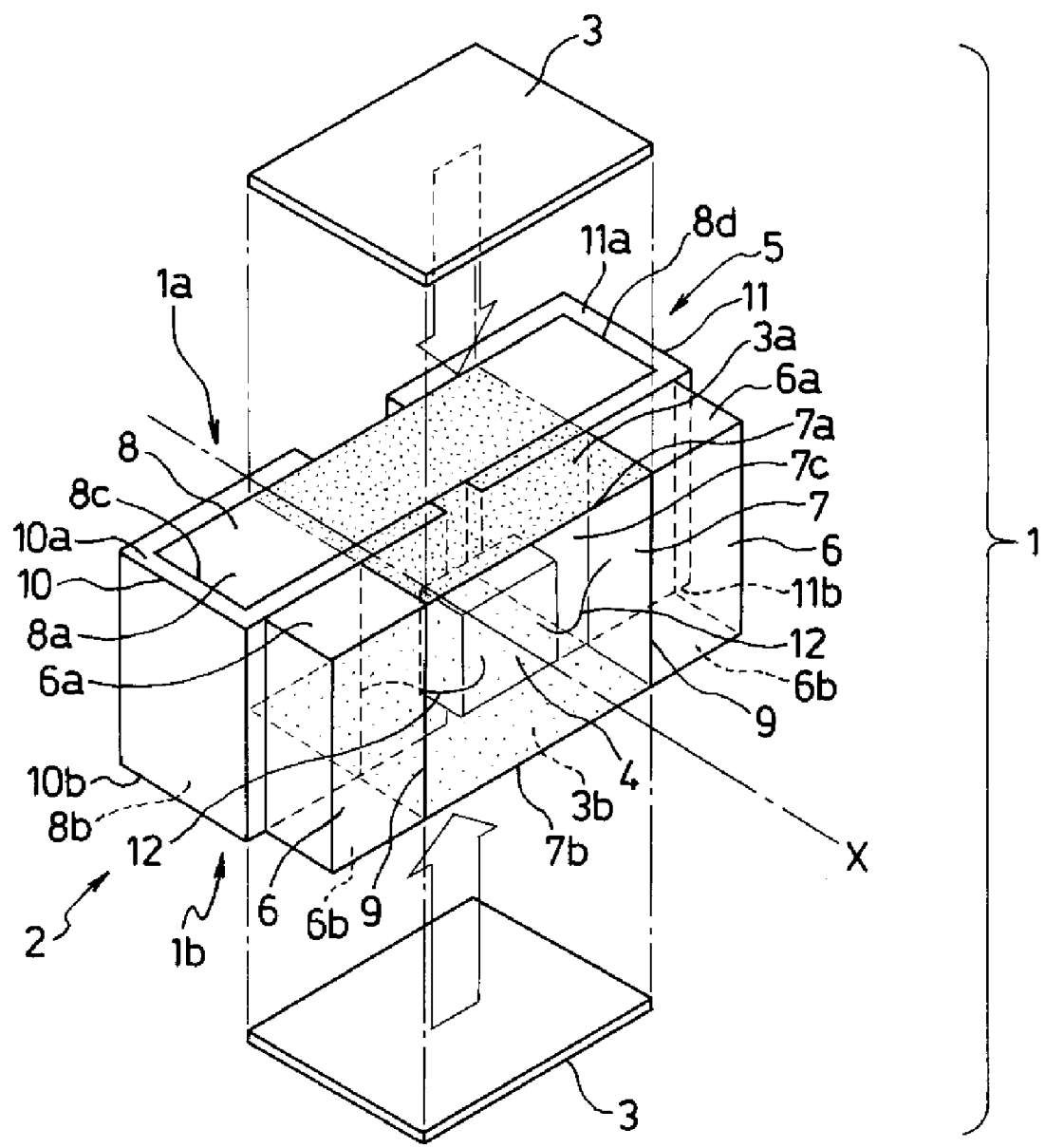
FIG. 4 is an exploded view showing the basic configuration of a semiconductor light emitting device made in accordance with principles of the presently disclosed subject matter.

First, a basic structure of the semiconductor light emitting device will be described with reference to FIG. 4 (being a schematic view). The semiconductor light emitting device 1 can include a semiconductor light emitting device main body 2 and a light-shielding reflective member 3 provided onto the semiconductor light emitting device main body 2 by, for example, coating or the like.

The semiconductor light emitting device main body 2 can include a semiconductor light emitting element 4, a substrate 5 for mounting the semiconductor light emitting element 4, a housing 6, and a sealing resin 7. The substrate 5 can include a white insulating support 8 and a pair of electrodes 10 and 11 supported by the white insulating support 8. The pair of the electrodes 10 and 11 can separately extend from one surface of the white insulating support 8 via respective side faces 8c and 8d to the other surface.

The housing 6 can be formed of the same material as that of the white insulating support 8 and can have a groove 9, which can be defined by a pair of opposed side faces and a pair of opposed opening areas. The housing 6 can be adjacent (i.e., abutting or in close proximity to) the insulating support 8.

The electrodes 10 and 11 can be exposed at the bottom of the groove 9 on the one surface of the white insulating support 8. The semiconductor light emitting element 4 can be disposed adjacent (i.e., abutting or in close proximity to) the bottom of the groove 9. The semiconductor light emitting element 4 can be arranged so as to span the area between the electrodes 10 and 11. The semiconductor light emitting element 4 can have a pair of electrodes thereon (not shown) to be electrically connected to the respective electrodes 10 and 11 via bonding wires 12.

The sealing resin 7 can be a transparent or translucent material and can be filled in the groove 9 so as to cover the semiconductor light emitting element 4, the bonding wires 12, and the like. The sealing resin 7 can protect the semiconductor light emitting element 4 from the surrounding environment including moisture, dust, gas, and the like as well as can protect the bonding wires 12 from the application of mechanical stress due to vibration, impact, and the like. The sealing resin 7 can form an interface with the light emission surface of the semiconductor light emitting element 4 so that the light emitted from the light emission surface can effectively enter the sealing resin 7.

A wavelength converting member or material, such as a phosphor, can be mixed into the sealing resin 7. In this case, the light emitted from the semiconductor light emitting element 4 can excite the wavelength converting member to wavelength-convert the light into light with a different color tone. In other words, this configuration can provide a color control function.

The white insulating support 8, electrodes 10 and 11, and housing 6 can define the substrate 5 as having a stacked structure. The electrodes 10 and 11 can be bonded to the support 8 by an adhesive member such as an adhesive, an adhesive sheet, weld, solder, or the like. The electrodes 10 and 11 can be formed of individual parts, each provided on respective surfaces and rejoined by an appropriate process, such as a plating treatment.

The light-shielding reflective member 3 can be composed of at least one resin such as, silicone resins, acrylic resins, epoxy resins, urethane resins, and other resins, and a reflective material having a light-shielding function such as $TiO_2$ or the like. Thus, the light-shielding reflective member 3 can have a proper light-shielding property and a desired reflectance.

The light-shielding reflective member 3 can be provided on the semiconductor light emitting device main body 2 by a coating process, such as a spraying, screen printing, ejection using a dispenser, ink-jet printing, a bar coating, a T-die coating, and the like. A liquid that has an appropriate viscosity for coating can form the light-shielding reflective member 3 of the presently disclosed subject matter. In order to adjust the viscosity of the liquid, the coating liquid can be diluted by an appropriate organic or inorganic solvent, such as toluene, xylene, isopropyl alcohol, or the like. In this case, the solvent should be appropriately evaporated and dried after coating.

Alternatively, the light-shielding reflective member 3 of the presently disclosed subject matter can be provided as a film having a light-shielding reflective function. The film can be prepared by forming a film using a mixture containing the resin and the light-shielding reflective material described above. In the following exemplary embodiments, the coated member is mainly exemplified as the light-shielding reflective member. The presently disclosed subject matter, however, is not limited to such an embodiment, but can include an embodiment in that a separately prepared light-shielding reflective film is provided on the semiconductor light emitting device main body to produce the specific desired effects.

The light-shielding reflective member 3 can include light-shielding reflective films 3a and 3b being parallel with the optical axis X of the semiconductor light emitting element 4 and coated at least on side faces 7a and 7b of the sealing resin 7 and the side faces 8a and 8b of the white insulating support 8 exposed to outside (or being a separate film adhere to the side faces 7a, 7b, 8a, and 8b).

It should be noted that a pair of side surfaces 1a and 1b on which the light-shielding reflective films 3a and 3b have been formed can be cut surfaces obtained when a plurality of semiconductor light emitting elements 4 are mounted on a multi-piece substrate at predetermined intervals, a sealing resin material is applied over the entire surfaces of the plurality of the mounted LED elements so as to form a sealing body, and then, the entire body is cut into separate pieces of semiconductor light emitting device main bodies with a predetermined size. Accordingly, the side face 8a of the white insulating support 8, side face 6a of the housing 6, side face 7a of the sealing resin 7, and respective end faces 10a and 11a of the electrodes 10 and 11, which can define the side surface 1a of the semiconductor light emitting device 1, can be substantially flush with one another (each have substantially the same level). Likewise, the side face 8b of the white insulating support 8, side face 6b of the housing 6, side face 7b of the sealing resin 7, and respective end faces 10b and 11b of the electrodes 10 and 11, which can define the side surface 1b of the semiconductor light emitting device 1, can be substantially flush with one another (each have the same level).

Accordingly, when the light-shielding reflective member is provided by coating, the light-shielding reflective films 3a and 3b formed on the respective side surfaces can have a uniform thickness with high planarity. In this case, examples of the light-shielding reflective films 3a and 3b are within the range of 10 μm to 200 μm, and when the semiconductor light emitting device 1 is mounted on a mounting substrate 5 to produce a very thin semiconductor light emitting device with a height of 0.5 mm or less, are within the range of 10 μm to 100 μm.

It should be noted that the following exemplary embodiments employ the semiconductor light emitting device main body 2 with the same structure and the light-shielding reflective films 3a and 3b are provided in different respective areas to produce the excellent optical actions and effects. The presently disclosed subject matter, however, is not limited to these specific exemplary embodiments.

Figure 5:
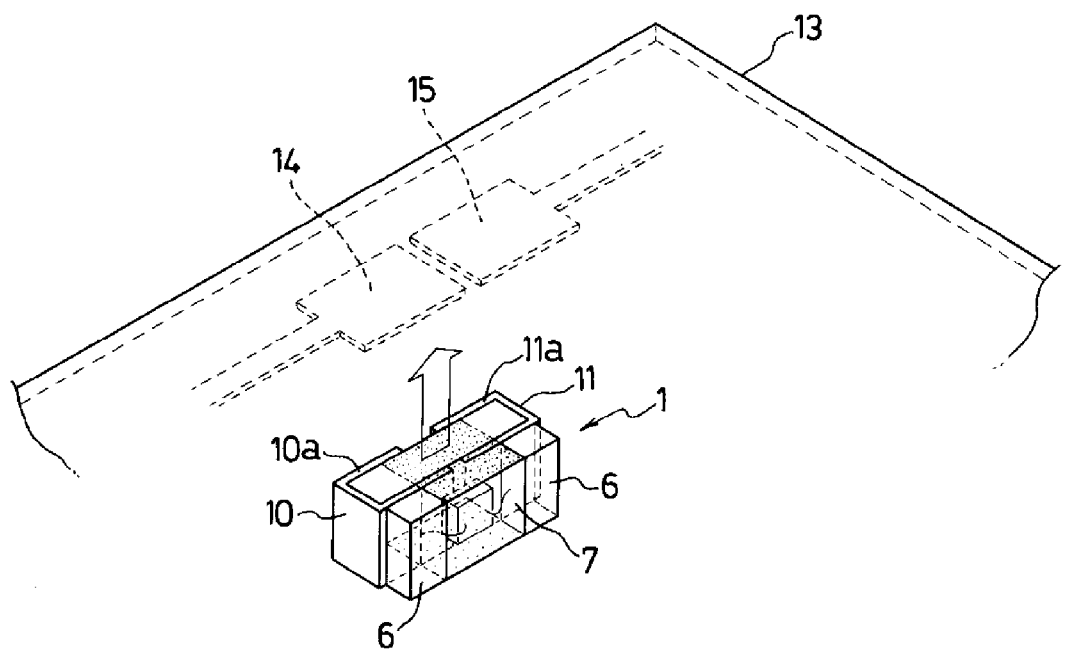
FIG. 5 is a diagram illustrating how the semiconductor light emitting device made in accordance with principles of the presently disclosed subject matter can be mounted on a board.

FIG. 5 shows the method for mounting the semiconductor light emitting device 1 on a mounting board 13 for mounting a semiconductor light emitting device thereon. A pair of electrode pads 14 and 15 can be formed on the mounting board 13 at areas generally aligned with the respective end faces 10a and 11a of the electrodes 10 and 11, the sealing resin 7, and the housing 6.

First, the semiconductor light emitting device 1 can be mounted on the electrode pads 14 and 15. In this state, the electrodes 10 and 11 can be soldered and bonded to the respective electrode pads 14 and 15 so that the semiconductor light emitting device 1 is fixed to the mounting board 13 and the electrodes 10 and 11 are electrically connected to the respective electrode pads 14 and 15.

In the following description, the surface of the semiconductor light emitting device 1 that is opposed to the mounting board 13 and to be adjacent (i.e., close proximity to or abutting) the mounting board 13 is referred to as the end face or side surface 1a and the other surface thereof opposite to the side surface 1a is referred to as the end face or side surface 1b.

Figure 6:
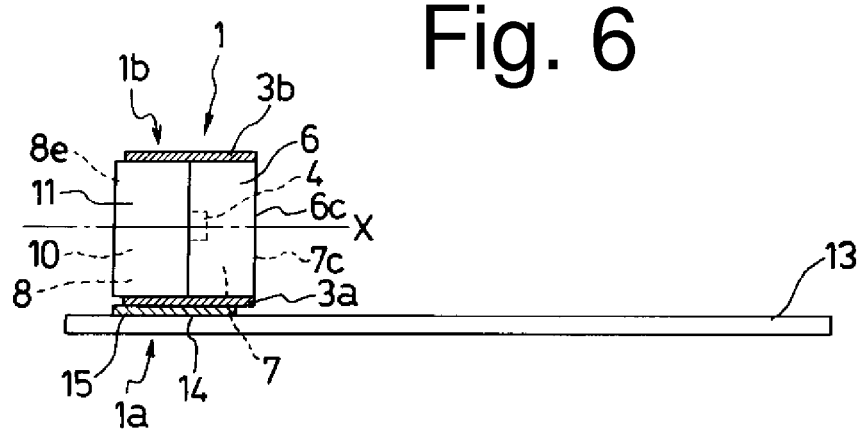
FIG. 6 is a diagram illustrating a semiconductor light emitting device according to a first exemplary embodiment, which is mounted on a board.

FIG. 6 shows the state where the semiconductor light emitting device 1 according to the first exemplary embodiment is mounted on the mounting board 13. In this exemplary embodiment, the area for the light-shielding reflective film 3a (3b) can extend from a position adjacent the edge of the front surface 6c of the housing 6 (or the light emission surface 7c) to a position adjacent the edge of the rear surface 8e of the white insulating support 8 in the optical axis X direction of the semiconductor light emitting device 1 on the side surface 1a (1b). In the exemplary embodiment of FIG. 6, the area can abut the edge of the front surface 6c and the area can be spaced from but in close proximity to the edge of the rear surface 8e.

In this manner, the semiconductor light emitting device 1 can be mounted on the electrode pads 14 and 15 of the mounting board 13 via the light-shielding reflective film 3a. When the electrodes 10 and 11 are soldered and bonded to the respective electrode pads 14 and 15 in this state, the semiconductor light emitting device 1 can be mounted on the mounting board 13 without being inclined regardless of the length of the electrode pads 14 and 15 as measured in the direction of the optical axis X.

FIGS. 7A to 7I show modifications of the first exemplary embodiment, illustrating the various coating areas of the light-shielding reflective films 3a and 3b on the side surfaces 1a and 1b of the semiconductor light emitting device 1. Note that these drawings are seen from the side surface 1a of the semiconductor light emitting device 1. In the modification shown in FIG. 7A, the area on the side surface 1a for the light-shielding reflective film 3a (3b) can extend in the direction of the optical axis X from a position adjacent the edge of the front surface 6c of the housing 6 (or the light emission surface 7c) where the area abuts the edge of the front surface 6c to a position adjacent the edge of the rear surface 8e of the white insulating support 8 where the area abuts the edge of the rear surface 8e. This area can also have the same width as that of the sealing resin 7 (i.e., the width of the side face 7a (7b)) as measured in the direction perpendicular to the X direction (hereinafter, referred to as Y direction).

This arrangement can prevent the inclination of the semiconductor light emitting device 1 with respect to the mounting board 13. At the same time, the light leakage from the side faces 7a and 7b of the sealing resin 7 and deterioration of directivity of light from the light emitting element 4 can be prevented to increase the utilization efficiency of light.

Figure 7A:
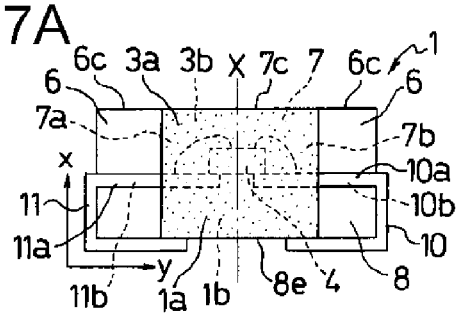
FIGS. 7A to 7I are diagrams illustrating various modifications of the semiconductor light emitting device according to the first exemplary embodiment.
Figure 7B:
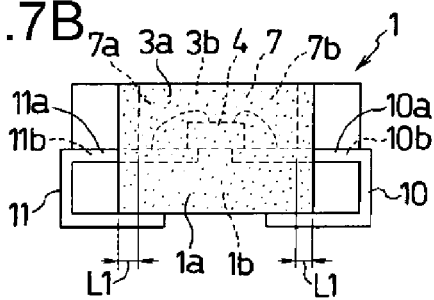

The semiconductor light emitting device 1 shown in FIG. 7B can be configured in a manner similar to that shown in FIG. 7A. In this example, the area on the side surface 1a (1b) for the light-shielding reflective film 3a (3b) can have a width greater than that of the sealing resin 7 as measured along the side face 7a (7b) in the Y direction. In the illustrated example, the area can extend beyond both edges of the side face 7a (7b) by the distance L1, where L1 can equal approximately 5 μm.

In this way, any light leakage from both the side faces 7a and 7b of the sealing resin 7 due to the coating accuracy of the light-shielding reflective films 3a and 3b can be reliably eliminated.

Figure 7C:
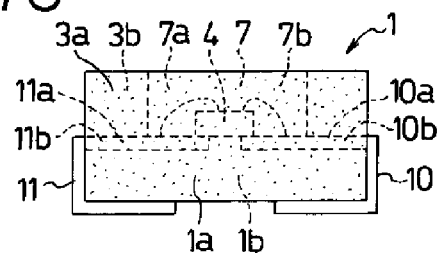

The semiconductor light emitting device 1 shown in FIG. 7C can be configured such that the area on the side surface 1a (1b) for the light-shielding reflective film 3a (3b) can have a width greater than that shown in FIG. 7B in the Y direction such that the area can extend across substantially the entire side surface 1a (1b).

This can maximize the contact area of the light-shielding reflective film 3a to the electrode pads 14 and 15 and can ensure the prevention of inclination of the semiconductor light emitting device 1 when mounted on the mounting board 13.

Figure 7D:
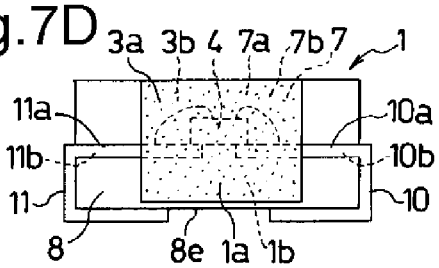
Figure 7E:
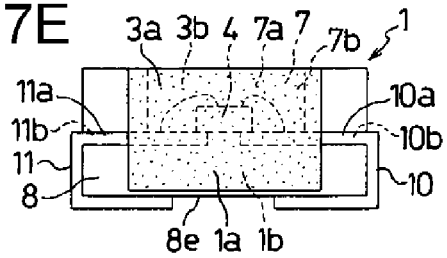

In contrast to the examples shown in FIGS. 7A and 7B, the semiconductor light emitting devices 1 shown in FIGS. 7D and 7E can be configured such that the area on the side surface 1a (1b) for the light-shielding reflective film 3a (3b) can extend to a position adjacent the edge of the rear surface 8e of the white insulating support 8 where the adjacent position is spaced inboard from the edge of the rear surface 8e in the X direction but is in close proximity to the edge of the rear surface 8e.

This can eliminate the adverse effect of inclination of the semiconductor light emitting device 1 when mounted on the mounting board 13 even if there is un-coated portion in the X direction due to the coating accuracy of the light-shielding reflective film 3a.

Figure 7F:
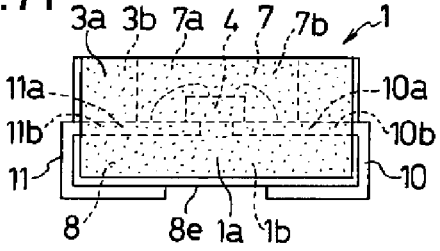

In contrast to the example shown in FIG. 7C, the semiconductor light emitting device 1 shown in FIG. 7F can be configured such that the area on the side surface 1a (1b) for the light-shielding reflective film 3a (3b) can extend to a position adjacent the edge of the rear surface 8e of the white insulating support 8 where the adjacent position is spaced inboard from the edge of the rear surface 8e in the X direction but is in close proximity to the edge of the rear surface 8e. Also, the area can be reduced in the Y direction as compared to FIG. 7C such that the area extends to a respective position adjacent each of the end portions of the side surface 1a (1b), where these adjacent positions are spaced inboard from the end portions of the side surface 1a (1b) but are in close proximity to the end portions of the side surface 1a (1b).

This can eliminate the adverse effect of inclination of the semiconductor light emitting device 1 when mounted on the mounting board 13 even if there is un-coated portion in the X direction and/or Y direction due to the coating accuracy of the light-shielding reflective film 3a.

Figure 7G:
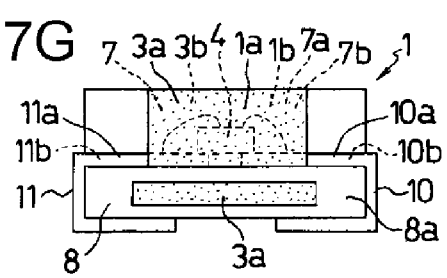
Figure 7H:
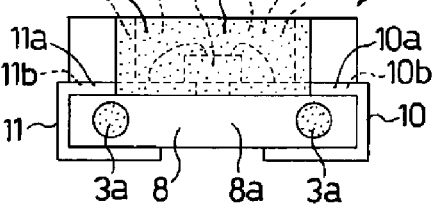
Figure 7I:
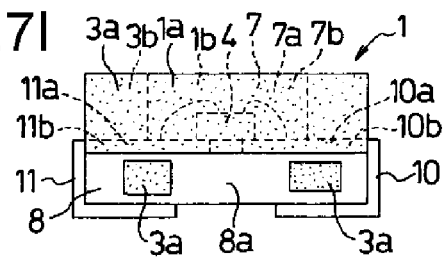

The semiconductor light emitting devices 1 shown in FIGS. 7G, 7H, and 7I can be configured with a width of the film 3a (3b) as measured in the X direction that is similar to the widths of the film 3a (3b) shown in FIGS. 7A, 7B, and 7C. However, the area on the side surface 1a (1b) for the light-shielding reflective film 3a (3b) can extend in the Y direction along the end face 7a (7b) of the sealing resin 7 and along the end faces 10a (10b) and 11a (11b) on the side of the electrodes 10 and 11 where the semiconductor light emitting element 4 is mounted. In addition to this, at least one additional light-shielding reflective film 3a can be provided on the side face 8a of the white insulating support 8.

With this configuration, the areas coated with the light-shielding reflective films 3a and 3b can be decreased, resulting in manufacturing cost reduction. When the light-shielding reflective films 3a and 3b are provided by coating, they can be easily formed at plural positions by appropriate setting to a coating machine.

In the illustrated examples, FIG. 7G shows a single additional light-shielding reflective film 3a on the side face 8a, and FIGS. 7H and 7I show two additional light-shielding reflective films 3a on the side face 8a. Each of these configurations can sufficiently increase the contact area of the light-shielding reflective films 3a to the electrode pads 14 and 15 and can ensure the prevention of inclination of the semiconductor light emitting device 1 when mounted on the mounting board 13.

Figure 8:
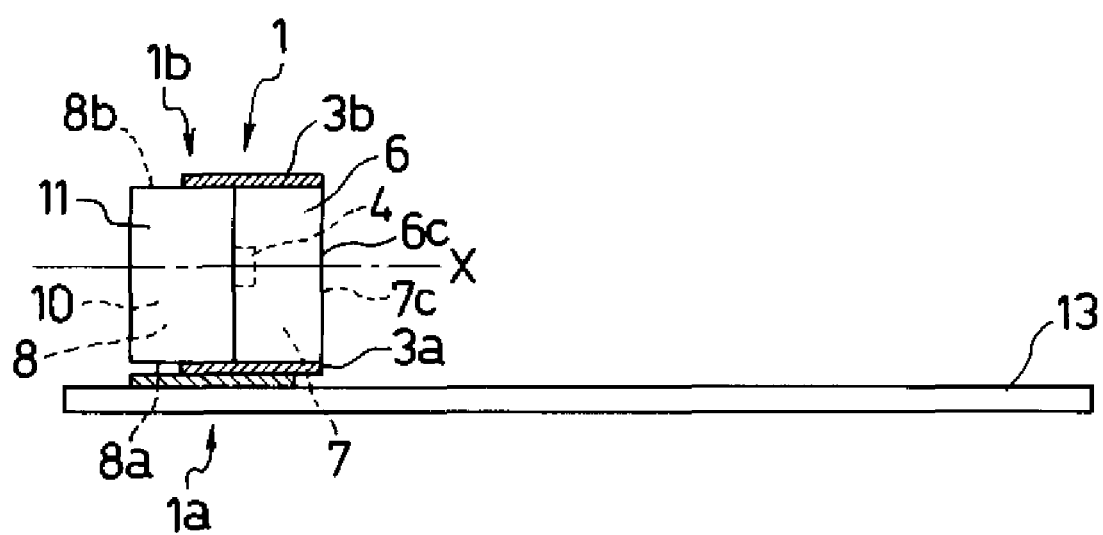
FIG. 8 is a diagram illustrating a semiconductor light emitting device according to a second exemplary embodiment, which is mounted on a board.

FIG. 8 shows the state where the semiconductor light emitting device 1 according to a second exemplary embodiment is mounted on the mounting board 13. In this exemplary embodiment, the area for the light-shielding reflective film 3a (3b) can extend along the side surface 1a (1b) in the X direction from a position adjacent (for example, abutting) the edge of the front surface 6c of the housing 6 (or the light emission surface 7c) to a position in the middle portion of the side face 8a (8b) of the white insulating support 8. Alternatively, the area can extend in the X direction from the position adjacent the edge of the front surface 6c (or light emission surface 7c) to a position intermediate the end portions of the electrode 10 (11) as shown in the cross-sections of FIGS. 9A to 9C.

In general, electrode pads formed on the mounting board may not always ideal for components to be mounted. For example, when the shape of an electrode is changed due to the change of the to-be-mounted component design, the shape of associated electrode pads may not correspondingly be changed in order to save the design manpower and costs. Even in this case, the length of such electrode pads in the X direction of the semiconductor light emitting device to be mounted can be assumed to be longer than the distance between the end portions of the electrode 10 (or 11) with the white insulating support 8 being interposed therebetween in the cross section.

In view of this, the area for the light-shielding reflective film 3a (3b) can extend from a position adjacent (for example, abutting) the edge of the front surface 6c of the housing 6 (or the light emission surface 7c) to the middle of the side face 8a (8b) of the white insulating support 8 in the X direction. In this way, the semiconductor light emitting device 1 can be mounted on the mounting board 13 without being inclined regardless of the length in the X direction of the electrode pads 14 and 15.

Figure 9A:
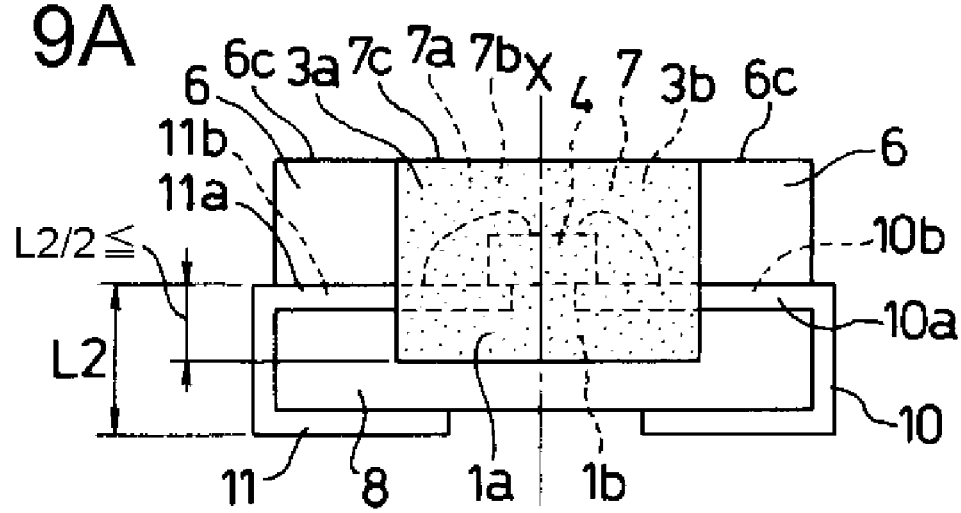
FIGS. 9A to 9C are diagrams illustrating various modifications of the semiconductor light emitting device according to the second exemplary embodiment.
Figure 9B:
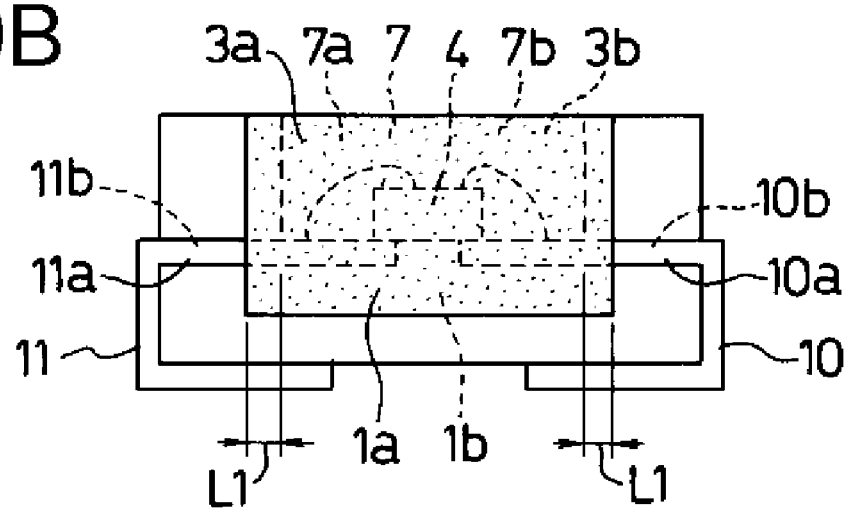
Figure 9C:
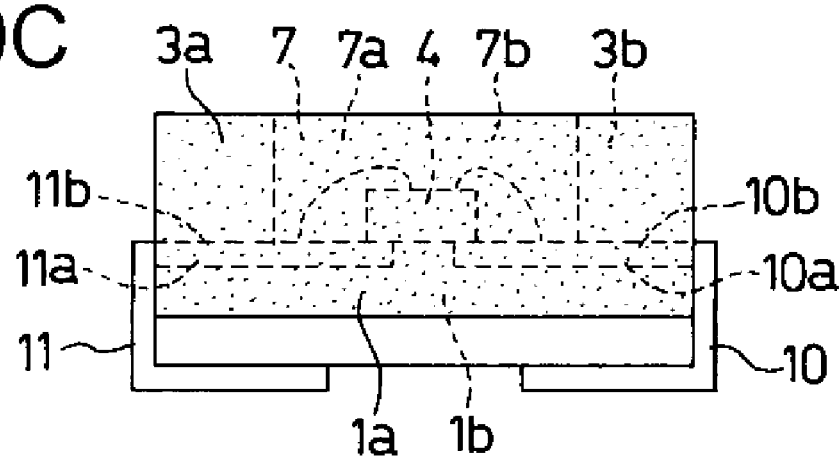

FIGS. 9A to 9C show modifications of the second exemplary embodiment, illustrating the various coating areas of the light-shielding reflective films 3a and 3b on the side surfaces of the semiconductor light emitting device 1. Note that these drawings are seen from the side surface 1a of the semiconductor light emitting device 1. In the modification shown in FIG. 9A, when the distance between the end portions of the electrode 10 (11) with the white insulating support 8 (from the front surface to the rear surface of the electrode) is denoted by L2, the area on the side surface 1a (1b) for the light-shielding reflective film 3a (3b) can extend from a position adjacent (for example, abutting) the edge of the front surface 6c of the housing 6 (or the light emission surface 7c) to a position where the distance between the position and the edge of the front surface of the white insulating support 8 is at least one-half of L2 (i.e., L2/2) in the X direction and with the same width as that of the sealing resin 7 (the width of the side face 7a (7b)) in the Y direction.

This arrangement can prevent the inclination of the semiconductor light emitting device 1 with respect to the mounting board 13. At the same time, the light leakage from the side faces 7a and 7b of the sealing resin 7 and deterioration of directivity of light from the light emitting element 4 can be prevented to increase the utilization efficiency of light.

The semiconductor light emitting device 1 shown in FIG. 9B can be configured such that the area on the side surface 1a (1b) for the light-shielding reflective film 3a (3b) can have a width that is greater than that of the sealing resin 7 as measured along the side face 7a (7b) in the Y direction. In the illustrated example, the area can extend beyond both edges of the side face 7a (7b) by the distance L1, where L1 can equal approximately 5 μm.

In this way, any light leakage from both the side faces 7a and 7b of the sealing resin 7 due to the coating accuracy of the light-shielding reflective films 3a and 3b can be reliably eliminated.

The semiconductor light emitting device 1 shown in FIG. 9C can be configured such that the area on the side surface 1a (1b) for the light-shielding reflective film 3a (3b) can have a width greater than that shown in FIG. 9B in the Y direction such that the area can extend across substantially the entire side surface 1a (1b).

This can maximize the contact area of the light-shielding reflective film 3a to the electrode pads 14 and 15 and can ensure the prevention of inclination of the semiconductor light emitting device 1 when mounted on the mounting board 13.

It should be noted that it is possible to provide an area of from several micrometers to several tens of micrometers in the X direction where the light-shielding reflective film is not provided as long as the inclination of the mounted semiconductor light emitting device 1 can be reliably prevented with the light-shielding reflective member 3.

Figure 10:
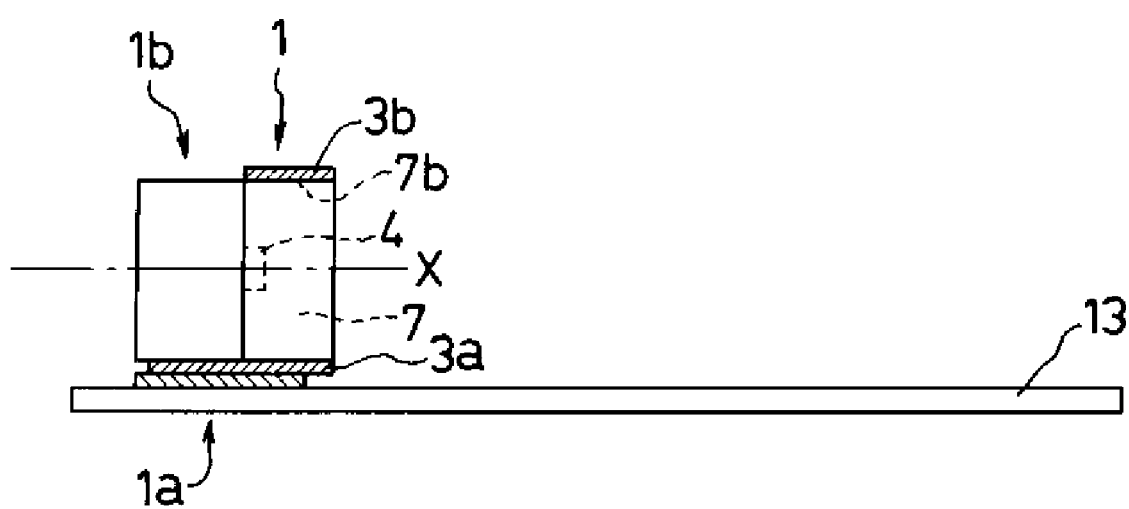
FIG. 10 is a diagram illustrating a semiconductor light emitting device according to a third exemplary embodiment, which is mounted on a board.

FIG. 10 shows the state where the semiconductor light emitting device 1 according to a third exemplary embodiment is mounted on the mounting board 13. In the present exemplary embodiment, the area where the light-shielding reflective film 3a is provided on the side surface 1a is different from that where the light-shielding reflective film 3b is provided on the side surface 1b.

Specifically, the area on the side surface 1a (which is the side being close to the mounting board 13) for the light-shielding reflective film 3a can cover a substantial portion of the side surface 1a both in the X direction and Y direction. In contrast, the area where the light-shielding reflective film 3b is provided on the side surface 1b (which is the opposite side to the mounting board 13) can cover at least the side face 7b of the sealing resin 7.

This can maximize the contact area of the light-shielding reflective film 3a to the electrode pads 14 and 15 and can ensure the prevention of inclination of the semiconductor light emitting device 1 when mounted on the mounting board 13. At the same time, the light leakage from the side faces 7a and 7b of the sealing resin 7 and deterioration of directivity of light from the light emitting element 4 can be prevented to increase the utilization efficiency of light. In addition to this, the area coated with the light-shielding reflective film 3b can be decreased, resulting in manufacturing cost reduction and manpower reduction.

Figure 11A:
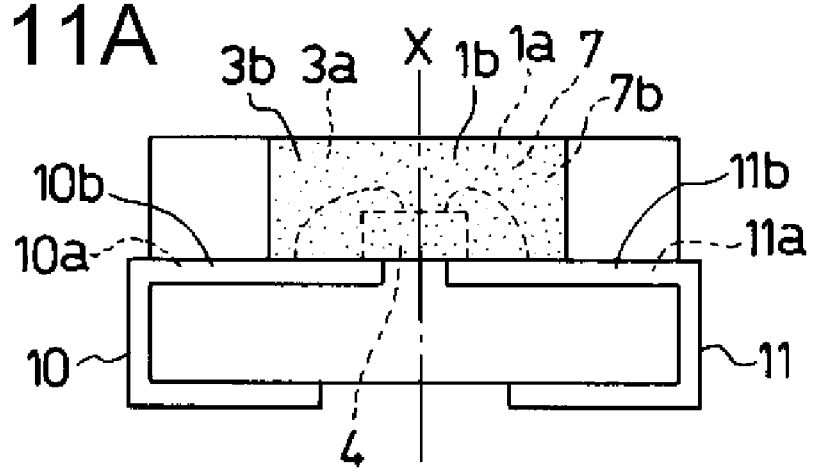
FIGS. 11A to 11C are diagrams illustrating various modifications of the semiconductor light emitting device according to the third exemplary embodiment.
Figure 11B:
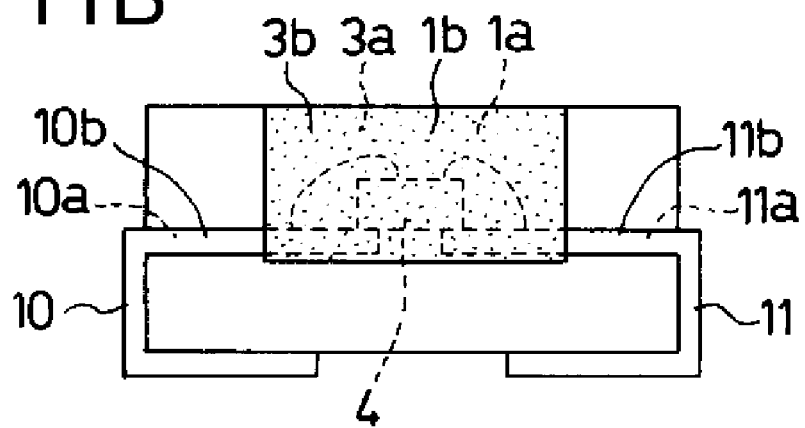
Figure 11C:
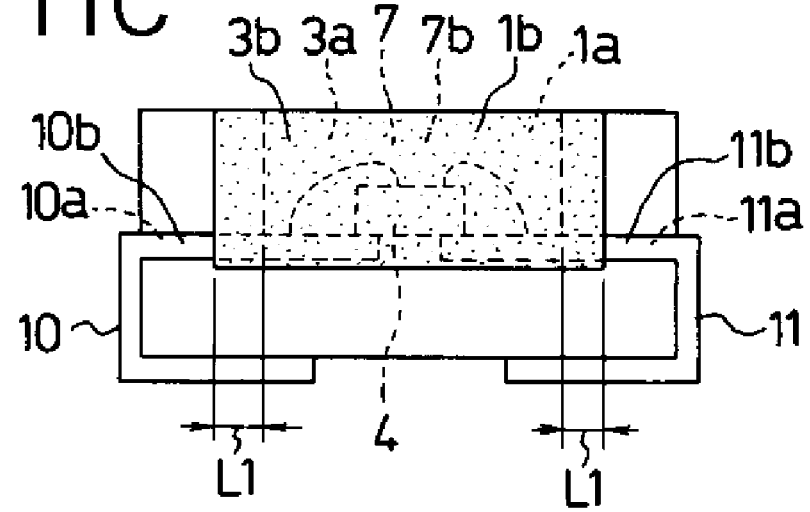

FIGS. 11A to 11C show modifications of the third exemplary embodiment, illustrating the various coating areas of the light-shielding reflective films 3a and 3b on the side surfaces of the semiconductor light emitting device 1. Note that these drawings are seen from the side surface 1b of the semiconductor light emitting device 1. The semiconductor light emitting device 1 shown in FIG. 11A can be configured such that the area on the side surface 1b for the light-shielding reflective film 3b can be confined to the side face 7b of the sealing resin 7. In this way, the light leakage from the side face 7b of the sealing resin 7 and deterioration of directivity of light from the light emitting element 4 can be prevented to increase the utilization efficiency of light.

The semiconductor light emitting device 1 shown in FIG. 11B can be configured with respect to that shown in FIG. 11A such that the area on the side surface 1b for the light-shielding reflective film 3b can include the end face 7b of the sealing resin 7 and an area covering the end faces 10b and 11b on the side of the electrodes 10 and 11 where the semiconductor light emitting element 4 is mounted.

The semiconductor light emitting device 1 shown in FIG. 11C can be configured with respect to that shown in FIG. 11B such that the area on the side surface 1b for the light-shielding reflective film 3b can have a width that is greater than that of the sealing resin 7 as measured along the side face 7b in the Y direction. In the illustrated example, the area can extend beyond both edges of the side face 7b by the distance L1, where L1 can equal approximately 5 μm.

In this way, any light leakage from the side face 7b of the sealing resin 7 due to the coating accuracy of the light-shielding reflective film 3b can be reliably eliminated.

Figure 12:
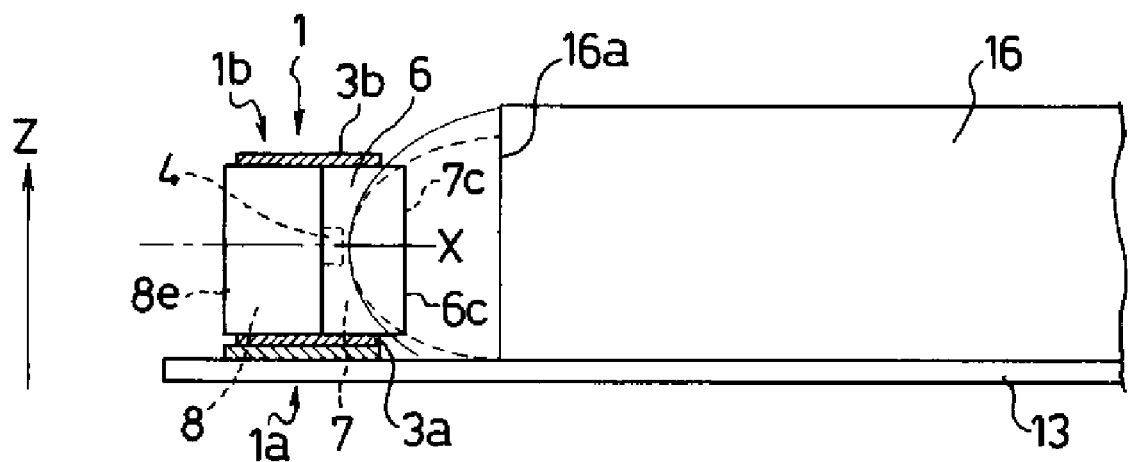
FIG. 12 is a diagram illustrating a semiconductor light emitting device according to a fourth exemplary embodiment, which is mounted on a board.
Figure 13A:
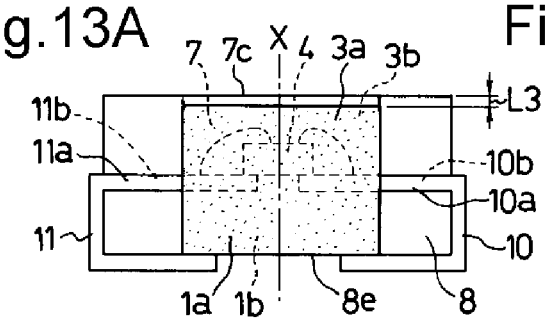
FIGS. 13A to 13F are diagrams illustrating various modifications of the semiconductor light emitting device according to the fourth exemplary embodiment.
Figure 13B:
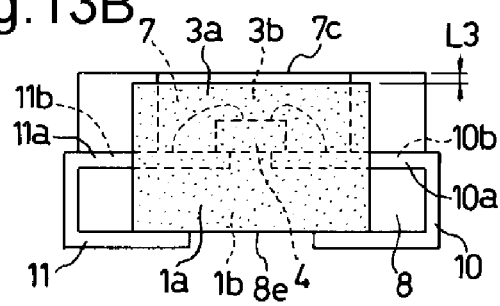
Figure 13C:
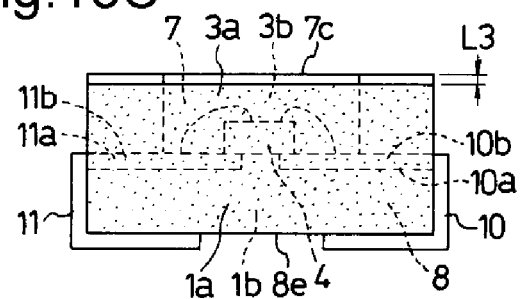
Figure 13D:
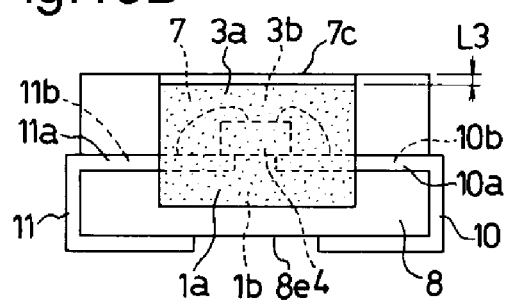
Figure 13E:
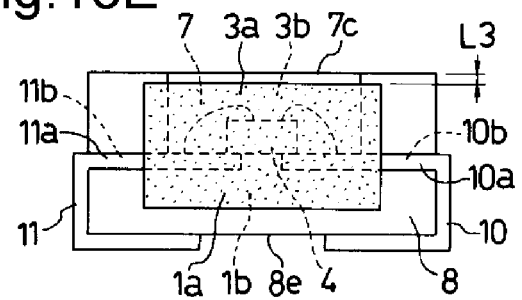
Figure 13F:
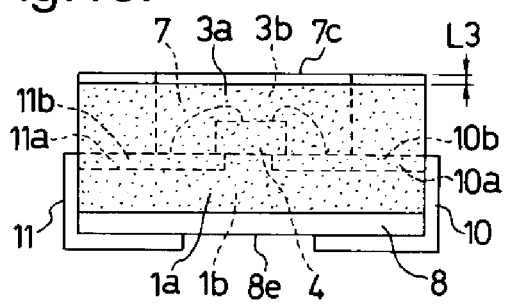

FIG. 12 shows the state where the semiconductor light emitting device 1 according to a fourth exemplary embodiment is mounted on the mounting board 13. In the present exemplary embodiment, the area for the light-shielding reflective film 3a (3b) can extend from a position inboard of the front surface 6c of the housing 6 (or the light emission surface 7c) to a position adjacent (i.e., abutting or in close proximity to) the edge of the rear surface 8e of the white insulating support 8 in the X direction on the side surface 1a (1b). In other words, there can be an uncoated area of the end face 7a or side surface 1a adjacent (for example, abutting) the front surface 6c in the X direction that can extend a predetermined distance from the front surface 6c toward the rear surface 8e.

Some backlight systems can employ a light guide plate 16 having a light incident surface 16a with a thickness in the vertical direction (for example, the Z direction in FIG. 12) larger than the thickness of the light emission surface 7c of the sealing resin 7 when the semiconductor light emitting device 1 is mounted on the mounting board 13. Even in this case, the semiconductor light emitting device 1 made in accordance with the principle of the presently disclosed subject matter can emit light not only from the light emission surface 7c but also from the uncoated area of the sealing resin 7 generally facing the light incident surface 16a of the light guide plate 16. Accordingly, the light emitted from the semiconductor light emitting element 4 can exit the sealing resin 7 with a wider emission area to be incident on the wide light incident surface 16a of the light guide plate 16 uniformly and effectively.

FIGS. 13A to 13F show modifications of the fourth exemplary embodiment, illustrating the various coating areas of the light-shielding reflective films 3a and 3b on the side surfaces of the semiconductor light emitting device 1. Note that these drawings are seen from the side surface 1a of the semiconductor light emitting device 1. The semiconductor light emitting devices 1 shown in FIGS. 13A to 13F can be configured such that the uncoated area of the light emission surface 7c of the sealing resin 7 can extend toward the rear surface 8e of the white insulating support 8 with a width L3 of approximately 10 μm to 150 μm. That is, the light-shielding reflective film 3a (3b) can lie adjacent the front surface 6c (or the light emission surface 7c) such that the light-shielding reflective film 3a (3b) can be spaced from but in close proximity to the front surface 6c (or the light emission surface 7c).

By doing so, the directivity of the emitted light from the semiconductor light emitting device 1 can be broadened to increase the light incident efficiency with respect to the light guide plate 16.

It should be noted that the other boundaries (in the X direction and Y direction other than the front boundary in the X direction) of area on the side surface 1a (1b) for the light-shielding reflective film 3a (3b) can be configured as shown in FIGS. 13A, 13B, 13C, 13D, 13E, and 13F which correspond to those shown in FIGS. 7A, 7B, 7C, 9A, 9B, and 9C, respectively. Accordingly, these descriptions will not be repeated. As in the case of FIG. 12, those shown in FIGS. 11A to 11C can have an uncoated area like the fourth exemplary embodiment as long as the inclination of the mounted semiconductor light emitting device 1 can be reliably prevented with the light-shielding reflective member 3.

In the illustrated semiconductor light emitting devices 1 in FIGS. 7A to 7I, 9A to 9C, 11B to 11C, and 13A to 13F, the end faces 10a and 11a of the electrodes 10 and 11 can be covered with the light-shielding reflective film 3a at the side of the electrodes 10 and 11 closer to the semiconductor light emitting element 4. The end faces 10b and 11b of the electrodes 10 and 11 also can be covered with the light-shielding reflective film 3b at the side of the electrodes 10 and 11 closer to the semiconductor light emitting element 4.

In these configurations, any short circuit between the electrodes 10 and 11 can be reliably prevented when the semiconductor light emitting device 1 is soldered and bonded to the mounting board 13. Any migration occurring from its surrounding environment containing moisture, dusts, particulates, and the like can be also prevented.

As described above, the semiconductor light emitting device made in accordance with the principles of the presently disclosed subject matter can utilize a pair of cut surfaces after manufacturing. On one of the cut surfaces that is the side to be mounted onto the mounting board, a light-shielding reflective film can be provided to cover the entire exposed surface of the sealing resin and at least part of the end face of the white insulating support. On the other cut surface, a light-shielding reflective film can be provided to cover at least the entire exposed surface of the sealing resin. The light-shielding reflective film can be provided by coating.

According to this configuration, the semiconductor light emitting device can be mounted on the mounting board without any inclination regardless of the length so that the optical axis of the semiconductor light emitting device can be maintained parallel with the board surface. In addition to this, the light emitted from the device can be advantageously allowed to enter the light guide plate.

Furthermore, any short circuit between the adjacent electrodes can be prevented when the semiconductor light emitting device is soldered and bonded to the mounting board. Any migration occurring from its surrounding environment containing moisture, dusts, particulates, and the like can be also prevented to realize a highly reliable semiconductor light emitting device.

Any light leakage from the side faces and the like of the sealing resin other than the light emission surface and deterioration of directivity of light from the light emitting element can be prevented to increase the utilization efficiency of light.

By providing an uncoated portion of the light-shielding reflective film near the light emission surface of the sealing resin, even when the light guide plate having a relatively larger light incident surface with respect to the light emission surface of the sealing resin is used, the light emitted from the semiconductor light emitting element can exit the sealing resin with a wider emission area to be incident on the wide light incident surface of the light guide plate uniformly and effectively. When the thickness of the light guide plate is changed, the coated area of the light-shielding reflective film can be adjusted to form an appropriate light emission area, thereby accommodating this change. This means that it may not be necessary to change the design of the semiconductor light emitting device itself, which can eliminate the necessity for the design change and manpower therefor as well as associated costs.

In the above-configured semiconductor light emitting device, the light-shielding reflective film can be limited to cover at least the exposed surface of the sealing resin on the side opposite to the side facing the mounting board in order to prevent any light leakage therefrom. This configuration can reduce the used amount of the light-shielding reflective member and coating time to reduce the manufacturing cost.

In the presently disclosed subject matter, examples of the semiconductor light emitting device can include an LED.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

The invention claimed is:

1. A semiconductor light emitting device configured to emit light along an optical axis, the semiconductor light emitting device comprising:
 a first side surface extending substantially parallel with the optical axis;
 a second side surface extending substantially parallel with the optical axis;
 an insulating support;
 a pair of electrodes formed on the insulating support;
 a housing including a groove having a bottom, the housing disposed adjacent the insulating support and exposing a portion of the pair of electrodes at the bottom of the groove;
 a semiconductor light emitting element disposed adjacent the bottom of the groove and connected to the exposed portion of the pair of electrodes;
 a sealing resin filled in the groove of the housing and including a light emission side through which light from the semiconductor light emitting element passes;
 each of the insulating support, the pair of electrodes, the housing, and the sealing resin including a first end face and a second end face, wherein each of the first end faces are substantially flush with one another and define the first side surface and each of the second end faces are substantially flush with one another and define the second side surface;
 the first end face of the sealing resin having a width extending in a direction perpendicular to the optical axis and including,
  a first edge extending along the light emission side, and
  a second edge opposed to the first edge and spaced from the light emission side in a direction along the optical axis, and
 the second end face of the sealing resin having a width extending in a direction perpendicular to the optical axis and including,
  a third edge extending along the light emission side, and
  a fourth edge opposed to the third edge and spaced from the light emission side in a direction along the optical axis; and
 a first light-shielding reflective member on the first side surface, extending in a direction of the optical axis from a position adjacent the first edge of the sealing resin to at least a position adjacent the second edge of the sealing resin, and extending in a direction perpendicular to the optical axis by a distance substantially equal to the width of the first end face of the sealing resin; and
 a second light-shielding reflective member on the second side surface, extending in a direction of the optical axis from a position adjacent the third edge of the sealing resin, beyond the fourth edge of the sealing resin, to a position that lies on the second end face of the insulating support, and the second light-shielding reflective member extending a distance substantially equal to the width of the second end face of the sealing resin.

2. The semiconductor light emitting device according to claim 1, wherein the second light-shielding reflective member extends in a direction of the optical axis to at least a middle position of the end face of the insulating support.

3. The semiconductor light emitting device according to claim 1, wherein:
the insulating substrate includes a rear side opposite to the light emission side and spaced in a direction of the optical axis from the light emission side; and
the first light-shielding reflective member extends in a direction of the optical axis from the first edge, beyond the second edge, to one of a middle position and an opposite position where the opposite position is located adjacent the rear side of the insulating support and the middle position is located intermediate the second edge and the opposite position.

4. The semiconductor light emitting device according to claim 2, wherein
the insulating substrate includes a rear side opposite to the light emission side and spaced in a direction of the optical axis from the light emission side; and
the first light-shielding reflective member extends in a direction of the optical axis from the first edge, beyond the second edge, to one of a middle position and an opposite position where the opposite position is located adjacent the rear side of the insulating support and the middle position is located intermediate the second edge and the opposite position.

5. The semiconductor light emitting device according to claim 1, further comprising a third light-shielding reflective member located on the second side surface and at least at a location on the second end face of the insulating support.

6. The semiconductor light emitting device according to claim 2, further comprising a third light-shielding reflective member located on the second side surface and at least at a location on the second end face of the insulating support.

7. The semiconductor light emitting device according to claim 3, further comprising a third light-shielding reflective member located on the second side surface and at least at a location on the second end face of the insulating support.

8. The semiconductor light emitting device according to claim 4, further comprising a third light-shielding reflective member located on the second side surface and at least at a location on the second end face of the insulating support.

9. The semiconductor light emitting device according to claim 1, wherein at least one of the first light-shielding reflective member and the second light-shielding reflective member has a width in a direction of the optical axis that is greater than the width of a respective one of the first and second end faces of the sealing resin.

10. The semiconductor light emitting device according to claim 2, wherein at least one of the first light-shielding reflective member and the second light-shielding reflective member has a width in a direction of the optical axis that is greater than the width of a respective one of the first and second end faces of the sealing resin.

11. The semiconductor light emitting device according to claim 3, wherein at least one of the first light-shielding reflective member and the second light-shielding reflective member has a width in a direction of the optical axis that is greater than the width of a respective one of the first and second end faces of the sealing resin.

12. The semiconductor light emitting device according to claim 4, wherein at least one of the first light-shielding reflective member and the second light-shielding reflective member has a width in a direction of the optical axis that is greater than the width of a respective one of the first and second end faces of the sealing resin.

13. The semiconductor light emitting device according to claim 5, wherein at least one of the first light-shielding reflective member and the second light-shielding reflective member has a width in a direction of the optical axis that is greater than the width of a respective one of the first and second end faces of the sealing resin.

14. The semiconductor light emitting device according to claim 6, wherein at least one of the first light-shielding reflective member and the second light-shielding reflective member has a width in a direction of the optical axis that is greater than the width of a respective one of the first and second end faces of the sealing resin.

15. The semiconductor light emitting device according to claim 7, wherein at least one of the first light-shielding reflective member and the second light-shielding reflective member has a width in a direction of the optical axis that is greater than the width of a respective one of the first and second end faces of the sealing resin.

16. The semiconductor light emitting device according to claim 8, wherein at least one of the first light-shielding reflective member and the second light-shielding reflective member has a width in a direction of the optical axis that is greater than the width of a respective one of the first and second end faces of the sealing resin.

17. The semiconductor light emitting device according to claim 1, wherein at least one of the first light-shielding reflective member and the second light-shielding reflective member is spaced inwardly in a direction of the optical axis from a respective one of the first and third edges at the light emission side of the sealing resin.

18. The semiconductor light emitting device according to claim 2, wherein at least one of the first light-shielding reflective member and the second light-shielding reflective member is spaced inwardly in a direction of the optical axis from a respective one of the first and third edges at the light emission side of the sealing resin.

19. The semiconductor light emitting device according to claim 1, wherein the second end face is configured to be mounted on a mounting board.

20. A method for fabricating the semiconductor light emitting device of claim 1, comprising:
providing a multi-piece semiconductor light emitting device body including the insulating support, the pair of electrodes formed on the insulating support, the housing including a groove having a bottom, the housing disposed adjacent the insulating support and exposing a portion of the pair of electrodes at the bottom of the groove, the plurality of semiconductor light emitting elements disposed adjacent the bottom of the groove at predetermined intervals and connected to the exposed portion of the pair of electrodes, and the sealing resin filled in the groove of the housing and entirely sealing the plurality of semiconductor light emitting elements, wherein the sealing resin includes a light emission surface through which light from the plurality of semiconductor light emitting elements passes;
cutting the multi-piece semiconductor light emitting device body in predetermined intervals to produce an individual semiconductor light emitting device body having an optical axis and a pair of opposed cut end faces, wherein a first one of the pair of cut end faces includes a first exposed face of the sealing resin having a width extending in a direction perpendicular to the optical axis, and wherein a second one of the pair of cut end faces includes a second exposed face of the insulating support and a second exposed face of the sealing resin, the second exposed face including a second edge abutting the light emission surface, and the second exposed face of the sealing resin having a width extending in a direction perpendicular to the optical axis;

covering the first one of the pair of cut end faces with the first light-shielding reflective member such that first light-shielding reflective member entirely covers the first exposed face of the sealing resin; and covering a second area on the second one of the pair of cut end faces with the second light-shielding reflective member, wherein the second area extends in a direction of the optical axis from a position adjacent the second edge of the sealing resin to at least a position in a middle of the exposed face of the insulating support, and the second area having a width extending in a direction perpendicular to the optical axis that is substantially equal to the width of the second exposed face of the sealing resin.

21. The method for fabricating a semiconductor light emitting device according to claim 20, wherein:
providing the pair of electrodes includes,
providing end portions on the pair of electrodes, and
mounting the plurality of semiconductor light emitting elements on the end portions;
cutting includes cutting the multi-piece semiconductor light emitting device body to produce the first exposed face of the sealing resin including,
a first edge abutting the light emission surface and an opposite edge adjacent to a respective one of the plurality of semiconductor light emitting elements,
a first exposed face of the end portions of the pair of electrodes, and
a first exposed face of the insulating support; and
covering the first one of the pair of cut end faces includes covering a first area of the first one of the pair of cut end faces extending from a position adjacent the first edge of the sealing resin to a position adjacent at least one of:
the opposite edge of the sealing resin;
the first exposed face of the end portions of the pair of electrodes wherein the first area including first exposed face of the end portions in its entirety; and
a middle of the first exposed face of the insulating support, wherein
the first area has a width extending in a direction perpendicular to the optical axis that is substantially equal to the width of the first exposed face of the sealing resin.

22. A method for fabricating the semiconductor light emitting device according to claim 1, comprising:
providing a multi-piece semiconductor light emitting device body including the insulating support, the pair of electrodes formed on the insulating support, the housing including a groove having a bottom, the housing disposed adjacent the insulating support and exposing a portion of the pair of electrodes at the bottom of the groove, the plurality of semiconductor light emitting elements disposed adjacent the bottom of the groove at predetermined intervals and connected to the exposed portion of the pair of electrodes, and the sealing resin filled in the groove of the housing and entirely sealing the plurality of semiconductor light emitting elements, wherein the sealing resin includes a light emission surface through which light from the plurality of semiconductor light emitting elements passes;

cutting the multi-piece semiconductor light emitting device body in predetermined intervals to produce an individual semiconductor light emitting device body having an optical axis and a pair of opposed cut end faces, wherein a first one of the pair of cut end faces includes a first exposed face of the sealing resin, the first exposed face of the sealing resin including a first edge abutting the light emission surface and an opposite edge adjacent a respective one of the plurality of semiconductor light emitting elements, and wherein a second one of the pair of cut end faces includes,
a second exposed face of the insulating support, and
a second exposed face of the sealing resin having a width extending in a direction perpendicular to the optical axis and including a second edge abutting the light emission surface;
covering a first area on the first one of the pair of cut end faces with a first light-shielding reflective member, wherein the first area extends from a position spaced inwardly in a direction of the optical axis from the first edge of the sealing resin to a position adjacent the opposite edge of the sealing resin; and
covering a second area of the second one of the pair of cut end faces with a second light-shielding reflective member, wherein the second area extends from a position spaced inwardly in a direction of the optical axis from the second edge of the sealing resin to at least a position adjacent a middle of the second exposed face of the insulating support, and the second area having a width extending in a direction perpendicular to the optical axis that is substantially equal to the width of the second exposed face of the sealing resin.

23. A method for fabricating the semiconductor light emitting device according to claim 1, comprising:
providing a multi-piece semiconductor light emitting device body including the insulating support, the pair of electrodes formed on the insulating support, the housing including a groove having a bottom, the housing disposed adjacent the insulating support and exposing a portion of the pair of electrodes at the bottom of the groove, the plurality of semiconductor light emitting elements disposed adjacent the bottom of the groove at predetermined intervals and connected to the exposed portion of the pair of electrodes, and a sealing resin filled in the groove of the housing and entirely sealing the plurality of semiconductor light emitting elements, wherein the sealing resin includes a light emission surface through which light from the plurality of semiconductor light emitting elements passes;
cutting the multi-piece semiconductor light emitting device body in predetermined intervals to produce an individual semiconductor light emitting device body having an optical axis and a pair of opposed cut end faces, wherein a first one of the pair of cut end faces includes a first exposed face of the sealing resin, and wherein a second one of the pair of cut end faces includes,
a second exposed face of an insulating support,
a second exposed face of the sealing resin, the second exposed face of the sealing resin having a width extending in a direction perpendicular to the optical axis, and the second exposed face of the sealing resin includes a second edge abutting the light emission surface, and
a second exposed face of the exposed portion of the pair of electrodes;

covering the first exposed face of the sealing resin in its entirety with a first light-shielding reflective member;

covering a second area on the second one of the pair of cut end faces with a second light-shielding reflective member, wherein the second area extends in a direction of the optical axis from a position adjacent the second edge of the sealing resin to at least a portion of the second exposed face of the exposed portion of the pair of electrodes, wherein the second area has a width in a direction perpendicular to the optical axis along the exposed face of the exposed portion of the pair of electrodes substantially equal to the width of second the exposed face of the sealing resin; and covering a portion of the exposed face of the insulating support with a third light-shielding reflective member.

24. The method for fabricating a semiconductor light emitting device according to claim 23, wherein:

providing the pair of electrodes includes,
providing end portions on the pair of electrodes, and
mounting the plurality of semiconductor light emitting elements on the end portions;

cutting includes cutting the multi-piece semiconductor light emitting device body to produce,
the first exposed face of the sealing resin,
a first edge abutting the light emission surface and an opposite edge adjacent a respective one of the plurality of semiconductor light emitting elements,
a first exposed face of the end portions of the pair of electrodes, and
a first exposed face of the insulating support; and covering the first one of the pair of cut end faces includes
covering a first area of the first one of the pair of cut end faces extending from a position adjacent the first edge of the sealing resin to a position adjacent at least one of,
the opposite edge of the sealing resin,
the first exposed face of the end portions of the pair of electrodes, wherein the first area includes the first exposed face of the end portions in its entirety, and
a middle of the first exposed face of the insulating support, wherein the first area has a width extending in a direction perpendicular to the optical axis that is substantially equal to the width of the first exposed face of the sealing resin.

25. The method for fabricating a semiconductor light emitting device according to claim 23, wherein:

providing the pair of electrodes includes,
providing end portions on the pair of electrodes, and
mounting the plurality of semiconductor light emitting elements on the end portions;

cutting includes cutting the multi-piece semiconductor light emitting device body to produce,
a first exposed face of the end portions of the pair of electrodes, and
a first edge of the sealing resin abutting the light emission surface;

covering with the first light-shielding reflective member includes covering a first area of the first one of the pair of cut end faces with the first light-shielding reflective member, wherein the first area extends from a position adjacent the first edge of the sealing resin to at least a portion of a first exposed face of an end portion of the pair of electrodes, and the first area has a width extending in a direction perpendicular to the optical axis that is substantially equal to a width of the first exposed face of the sealing resin; and further comprising, covering a portion of the second exposed face of the insulating support with a fourth light-shielding reflective member.

* * * * *